United States Patent [19]
Tokunaga

[11] Patent Number: 5,117,319
[45] Date of Patent: May 26, 1992

[54] MAGNETIC MOVEMENT SENSING DEVICE

[75] Inventor: Ichiro Tokunaga, Miyagi, Japan

[73] Assignee: Alps Electric Co., Ltd., Tokyo, Japan

[21] Appl. No.: 420,190

[22] Filed: Oct. 12, 1989

Related U.S. Application Data

[63] Continuation-in-part of Ser. No. 112,675, Oct. 23, 1987, abandoned.

[30] Foreign Application Priority Data

Feb. 18, 1987 [JP] Japan ................ 62-35362

[51] Int. Cl.$^5$ .................................................. G11B 5/127
[52] U.S. Cl. ...................................................... 360/113
[58] Field of Search ........................ 360/113; 338/32 R

[56] References Cited

U.S. PATENT DOCUMENTS

| | | | |
|---|---|---|---|
| 4,418,372 | 11/1983 | Hayashida et al. | 360/113 |
| 4,477,794 | 10/1984 | Nomura et al. | 338/32 R |
| 4,492,997 | 1/1985 | Arai et al. | 360/113 |
| 4,503,394 | 3/1985 | Kawakami et al. | 360/113 X |
| 4,535,375 | 8/1985 | Mowry et al. | 360/113 |
| 4,556,925 | 12/1985 | Suenaga et al. | 360/113 |
| 4,616,281 | 10/1986 | Nakamura | 360/113 |
| 4,639,806 | 1/1987 | Kira et al. | 360/113 |
| 4,698,711 | 10/1987 | Vinal | 360/113 |

FOREIGN PATENT DOCUMENTS

| | | | |
|---|---|---|---|
| 58-211304 | 12/1983 | Japan | 360/113 |
| 63-142511 | 6/1988 | Japan | 360/113 |

OTHER PUBLICATIONS

*IBM/TDB* vol. 20, No. 2, Jul. 1977 "Magnetically coupled Barberpole MR Head . . . " by Romankiw.

Primary Examiner—John W. Wolff
Attorney, Agent, or Firm—Guy W. Shoup; B. Noel Kivlin

[57] ABSTRACT

A magnetic sensor for an encoder having tracks arranged alternately with N- and S-poles, comprising two MR thin films arranged at a near interval in the track direction with a direction perpendicular to the tracks as a longitudinal direction, oblique electrode formed obliquely to the longitudinal direction on the magnetoresistance effect detecting magnetic thin films to generate a bias magnetic field of opposite directions parallel to the tracks by a current flowing to the oblique electrodes in the MR thin films, thereby detecting poles arranged at random intervals.

9 Claims, 4 Drawing Sheets

MAGNETIC MOVEMENT SENSING DEVICE

CROSS REFERENCE TO RELATED APPLICATION

This application is a continuation-in-part of patent application Ser. No. 07/112,675 filed Oct. 23, 1987, now abandoned.

BACKGROUND OF THE INVENTION

1. Field of the Invention

This invention relates to a magnetic sensor for an encoder which can detect N- and S-poles arranged at a random interval on the drum of the encoder.

Referring now to FIGS. 6 and 7, a conventional type of magnetic type movement detecting device will be described. The conventional type of magnetic rotary encoder which is one example of such a magnetic type movement detecting device as described above is comprised of a rotary drum 3 and a magnetic sensor oppositely arranged against the rotary drum 3 in a non-contacted condition. The magnetic recording medium arranged at a circumferential surface of the rotary drum 3 is provided with several linear-form poles with their N-poles and S-poles alternatively arranged in a particular spacing (a specified magnetizing pitch) which constitutes a scale, crossed at a right angle with a thickness direction of the magnetic recording medium and with a horizontal magnetization in a direction parallel with the relative movement between the rotary drum and the magnetic sensor. From the track which is comprised of a linear arrangement of these magnetic poles, magnetic fluxes are discharged which are directed toward the space in which the magnetic sensor is arranged These magnetic fluxes cross at a right angle to the magnetoresistance effective magnetic thin films 1, 2 (hereinafter referred to as "MR thin film") shown in FIG. 6 which are a pair of magnetic flux detecting portions arranged in the magnetic sensor. The MR thin films 1 and 2 are made of ferromagnetic material such as Fe-Ni and the like, have a narrow width direction which is a direction of relative movement with the tracks wherein a density of crossing magnetic fluxes and their polarities are varied under a rotation of the rotary drum, and have a long direction crossing at a right angle this relative movement direction, and have a strip-like shape with their longitudinal sides being adjacent in parallel to each other. Both ends of MR thin films 1 and 2 are provided with an electrode for use in applying and connecting a bias current. One of the connecting electrodes arranged at MR thin films 1 and 2 is connected by a conductive pattern so as to act as an output terminal for use in providing a detecting signal, and the connecting electrodes of each of the remaining ends are connected to a positive pole and a negative pole of the power supply through a conductive pattern, respectively. In this way, the bias currents are applied oppositely to each other in a longitudinal direction of the strip-like lines to the MR thin films 1 and 2 connected in series with the power supply. An electrical resistance of each of MR thin films 1 and 2 with this bias current applied is such that thin films 1 and 2 each show substantially the same intermediate resistance value, while the magnetic fluxes may not be crossed with these MR thin films 1 and 2. As the density and polarity of the magnetic fluxes crossing MR thin films 1 and 2 are varied, an electrical resistance between the connecting electrodes connected to each of both ends of MR thin films 1 and 2 is varied from a maximum value to a minimum value so as to detect a variation in voltage at a common connection point between MR thin films 1 and 2. As shown in a top plan view in FIG. 6, the arrangement of each of MR thin films 1 and 2 having such a characteristic of a ferromagnetic-electrical conversion as described above is made such that a spacing in the directions of relative movements of the tracks indicated by arrows in FIG. 6 shows a pitch spaced apart by $\frac{1}{4}\lambda$ in respect to a spacing $\lambda$ of magnetic poles having the same polarities shown in FIG. 7(a). A variation of electrical resistance in respect to a direction of the magnetic fluxes crossing each of the MR thin films 1 and 2 arranged with a pitch of $\frac{1}{4}\lambda$ and with a power supply voltage of +5 V applied, for example, in series therewith has a shape magnetic anisotropy characteristic in which it is decreased with the magnetic fluxes crossing with each other in the width directions having a narrow strip-like line and it is dependent upon a pattern shape having no variation in resistance with the magnetic fluxes crossed in a longitudinal direction and a film thickness direction. This characteristic of magnetic anisotropy is not only dependent upon a shape, but also similarly applied to the MR thin film having a ferromagnetic thin film formed in the magnetic field applied in advance.

Under such an arrangement, if one MR thin film 1 is opposite just above the magnetic pole indicated by "N" or "S" in FIG. 7(a), the other MR thin film 2 is opposite to a position intermediate between the magnetic poles indicated by "N" and "S" or "S" and "N" in FIG. 7(a). Under this condition, a resistance value of one MR thin film 1 becomes a maximum value and a resistance value of the other MR thin film 2 becomes a minimum value, and then a detected signal appearing between the output terminal and the ground line (a power supply terminal of the negative pole) is outputted with the lowest voltage value. In turn, under a condition in which one MR thin film 1 is opposite to an intermediate position of magnetic poles indicated by "N" and "S" or "S" and "N" in FIG. 7(a), the other MR magnetic pole 2 is opposite to a part just above the magnetic pole indicated by "N" or "S" in FIG. 7(a). Under this condition, a resistance value of one MR thin film 1 becomes a minimum value, a resistance value of the other MR thin film 2 becomes a maximum value, and a detected signal appeared between the output terminal and the ground line (a power supply terminal of a negative pole) is outputted with the highest voltage value. In this way, as a result of a continuous rotation of the rotary drum, the detected signal may repeat a minimum voltage value and a maximum voltage value in response to a repetition of magnetic poles in which "N" and "S" are alternatively varied as shown in FIG. 7(a) in correspondence with a rotational angle of an amount of movement of the rotary drum and its varying speed. If MR thin films 1 and 2 are constructed such that they cross each other at a maximum density of magnetic flux only when they are opposite to an intermediate position of the magnetic poles indicated by "N" and "S" and "S" and "N" in FIG. 7(a), a signal indicated by a sine wave (for example, +2.5 V at the center) in FIG. 7(b) is outputted. Then a relative amount of movement between the rotary drum and the magnetic sensor and their speeds are discriminated by this sine wave. In addition, an output waveform is outputted in a shape of a trapezoid for the waveform caused by this detecting operation in the case that each of MR thin films 1 and 2 is opposite to a position except one just above the magnetic poles indicated by "N" and "N" in FIG. 7(a) and cross each other with a density of magnetic flux at a level where a variation of the resistance value is saturated.

In order to use a rotary encoder as a mode switch or an absolute switch, a magnetic sensor for an encoder which can detect the poles arranged at a random interval in response to the mode on a rotary drum is desired. However, the conventional magnetic sensor for the encoder can merely detect the poles arranged at an equal interval, but cannot detect the poles arranged at random intervals.

SUMMARY OF THE INVENTION

Accordingly, an object of this invention is to provide a magnetic sensor for an encoder which can eliminate the drawbacks of the conventional magnetic sensor for the encoder and which can detect poles arranged at random intervals.

In order to resolve the above-mentioned problem, the magnetic movement detecting device of the present invention is comprised of:

a magnetic scale having magnetic medium in which a spacing between at least a pair of adjoining magnetic poles is arranged in a relative different length toward a relative movement with a magnetic sensor and said magnetic poles are magnetized in an alternative polarity of N-pole and S-pole;

a first current path constructed on said magnetic sensor with a magnetoresistance effect thin film and arranged to show a magnetic anisotropy in such a direction as one in which an electrical resistance is varied under a condition that a direction of said magnetic scale crossing with a magnetic flux from said magnetic pole is in parallel with a direction of said relative movement, and the electrical resistance is not varied under a condition that the former direction is crossed at a right angle with a direction of said relative movement;

a second current path constructed on said magnetic sensor with a magnetoresistance effect thin film and arranged to show a magnetic anisotropy in parallel with the magnetic anisotropy of the first current path under a condition that an electrical resistance is varied while its spacing with said first current path 11 has a minimum pitch P of said magnetic pole spacing and a pitch d less than nonequal spacing and a direction of said magnetic scale crossing with the magnetic fluxes from the magnetic poles is in parallel with a direction of said relative movement, and the electrical resistance is not varied while the former direction is crossed with the direction of said relative movement;

a pair of first and second oblique electrodes composed of conductive material showing a sufficient low resistivity in respect to a resistivity of said first and second current paths over both surfaces of said second and first current paths, conductively arranged with said second and said first current paths in lower than areas of said second and first current paths in which the bias currents energized in said second and said first current paths flow in an angular direction crossing at a right angle in respect to an energizing direction of said biasing current, thereby self-biasing magnetic fields parallel to said relative movement direction of said magnetic poles and in an opposite directing polarities to each other are generated; and characterized in that a relative movement in respect to said magnetic scale is detected by a difference of a rate of variation of resistance based on a voltage value between each of both ends of said first and second current paths.

Since the oblique electrodes are formed on the two MR thin films arranged in the vicinity and the bias magnetic fields of opposite directions are generated parallel to the tracks in the MR thin films by currents flowing to the oblique electrodes, the magnetic field from the pole is applied in the thicknesswise direction of the two MR thin films at the position where the two MR thin films are opposed to the poles so that the resistance values of the two MR thin films are the same, but the magnetic field is applied from the pole parallel to the bias magnetic field perpendicularly to the longitudinal direction of the MR thin films at the position where not opposed to the poles to cancel the bias magnetic field in one MR thin film to increase the resistance value, and the magnetic field from the magnetic field is added to the bias magnetic field in the other MR thin film to increase the intensity of the magnetic field and to reduce the resistance value.

The above and other related objects and features of the invention will be apparent from a reading of the following description of the disclosure found in the accompanying drawings and the novelty thereof pointed out in the appended claims.

DESCRIPTION OF THE PREFERRED EMBODIMENTS

Figure 1:
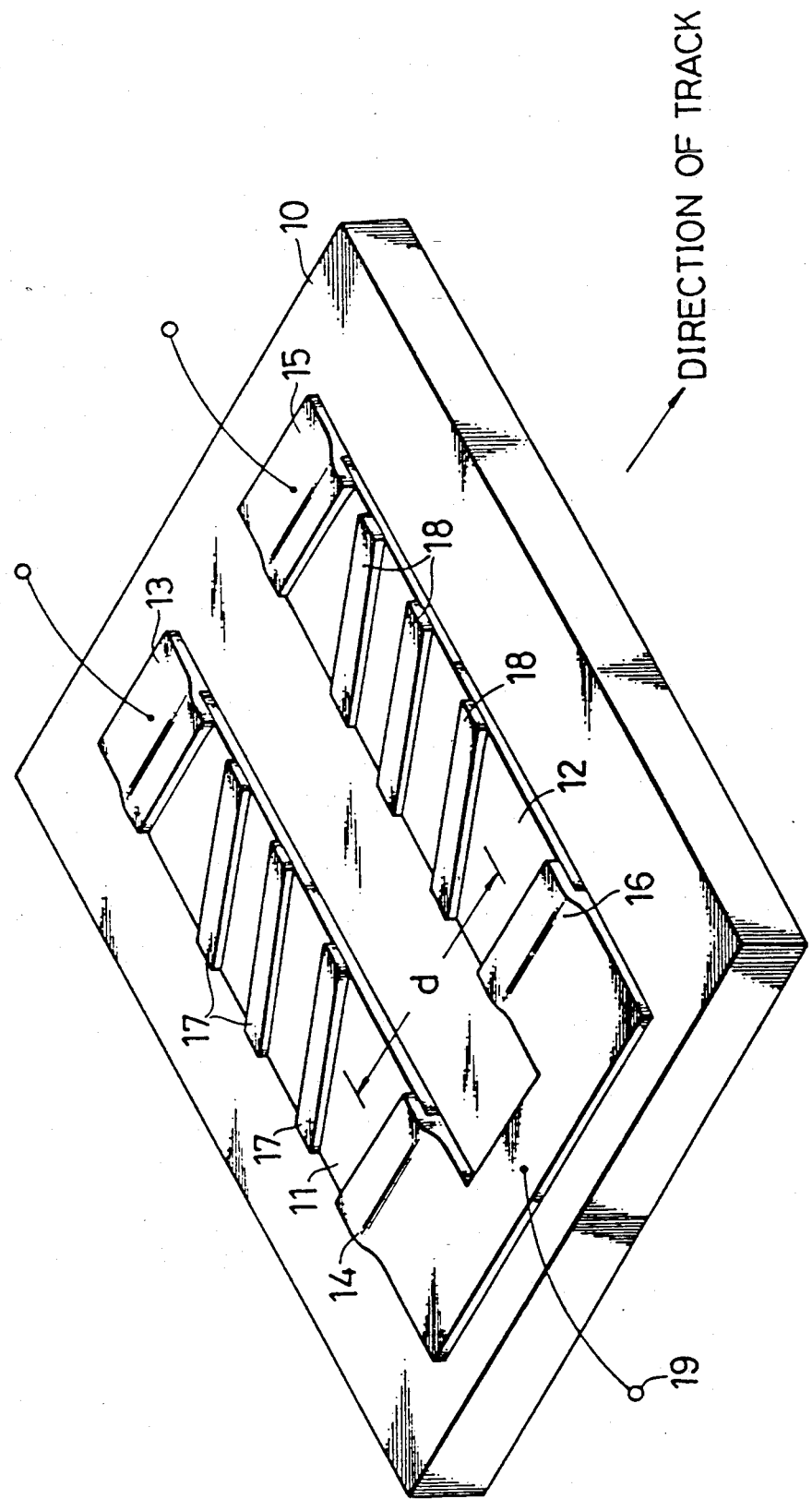
FIG. 1 is an external appearance perspective view of an embodiment of a magnetic sensor for an encoder according to the present invention.
Figure 3:
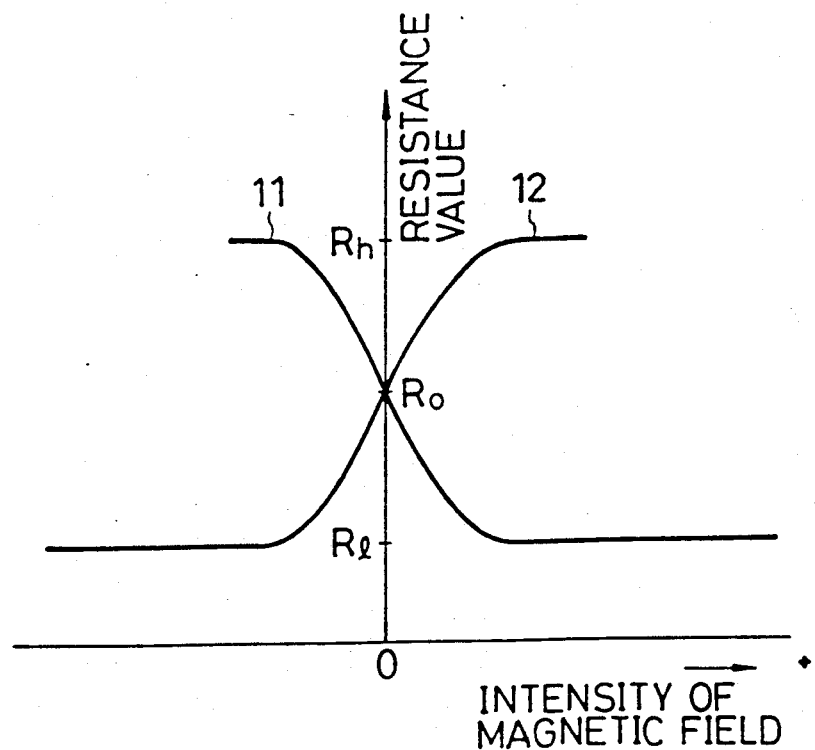
FIG. 3 is a characteristic graph showing the resistance value to the intensity of the magnetic field of two MR thin films.
Figure 4:
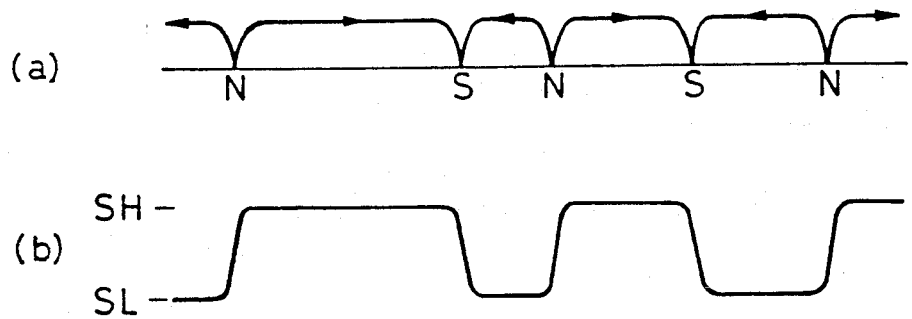
FIG. 4 is a view showing the signal output to the poles arranged at random.

Embodiments of the present invention will be described in detail with reference to FIGS. 1 to 4. FIG. 1 is a perspective view of an embodiment of a magnetic sensor for an encoder of the invention, FIG. 2 is a plan view of FIG. 1, FIG. 3 is a characteristic diagram showing the relationship between the resistance value and the intensity of the magnetic field of two MR thin films, and FIG. 4 shows a signal output generated in response to randomly arranged poles.

First, a constitution of the present system is described with reference to FIGS. 1 and 2. The portions the same as those of the prior art will be eliminated from the description.

On one side surface of the insulating plate 10 are arranged a pair of strip-like MR thin films 11 and 12. A characteristic of conversion between a magnetism and a resistance of the MR thin films 11 and 12 is the same as that of the MR thin films 1 and 2 which are as described above in the prior art description and have a shape magnetic anisotropy dependent upon their pattern shapes. The strip-like shapes are arranged with a minimum size of the magnetic pole pitch P between S-pole and N-pole of the track or a shorter spacing d (for example, 20 μm) than this magnetic pole pitch P. A pair of MR thin films 11 and 12 are arranged such that a thin film of ferromagnetic material (a thickness of 0.4 μm, for example) is formed by a vapor depositing and the formed ferromagnetic thin film is worked into a desired pattern of strip-like shape by means such as photolithography. The MR thin films 11 and 12 of strip-like shape are made such that some superior conductive materials such as Cu, Ag, Au or the like are vapor deposited to each of both longitudinal sides, electrodes 13, 14, 15 and 16 having a sufficient lower resistivity than those of the patterned MR thin films 11 and 12 are electrically connected and arranged, the electrodes 14 and 16 are electrically connected on the insulating plate 10, arranged as a signal output terminal 19, and the electrode 13 and the electrode 15 at each of the terminals of MR thin film 11 and MR thin film 12 are connected in series so that biasing current can be applied for instance by a +5 V power supply. Each of the surfaces of the MR thin films 11 and 12 has an electrical connection of a plurality of oblique electrodes 17, 17 . . . , 18, 18 . . . formed in the same step as those of the electrodes 13 to 16 and 19. The oblique electrodes 17, 17 . . . and 18, 18 . . . are arranged in an inclination angle of 45°, for example, and currents $I_1, I_1, \ldots I_2, I_2 \ldots$ for use in generating a self-biasing magnetic field from a high potential part to a low potential part generated on the ferromagnetic thin film by the energized biasing current are applied. These oblique electrodes 17, 17, . . . 18, 18 . . . are arranged on the MR thin film 11, for example, acting as one current path in the same width, thickness, length, direction and angle so as to generate a self-biasing magnetic field having the same direction in respect to the energized biasing current. Since the directions of the biasing currents flowing in the MR thin film 11 and the MR thin film 12 arranged in parallel to each other are opposite to each other, they may generate the self-biasing magnetic fields having opposite directions to each other. Both the oblique electrodes 17, 17 . . . arranged on the MR thin film 11, MR thin film 12 and the oblique electrodes 18, 18 . . . have the same width, thickness, length, direction and angle. This self-biasing magnetic field forms an angle (for example, 45°) which corresponds to an angular displacement of each of the oblique electrodes 17, 17 . . . 18, 18 . . . in respect to the direction of arrangement of MR thin film 11 and MR thin film 12. However, a variation of resistance of each of the MR thin films 11 and 12 caused by the self-biasing magnetic field showing this angle is varied dependent upon a vector component in a narrow width direction of each of MR thin films 11 and 12 in the magnetic fluxes crossed obliquely, due to the fact that MR thin films 11 and 12 have a magnetic anisotropy. Accordingly, a direction of the magnetic field contributing to a variation of resistance value is set such that only a self-biasing magnetic field $H_1$ in a direction of track and a magnetic flux $H_2$ crossed with a self-biasing magnetic field in an opposite direction are detected.

Figure 2:
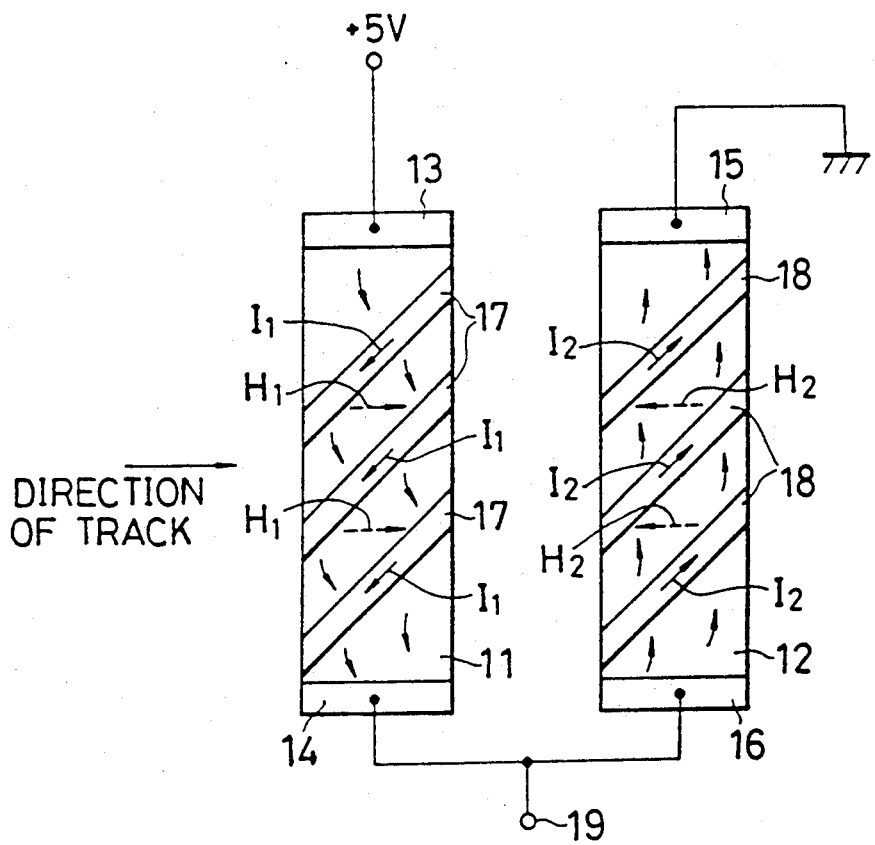
FIG. 2 is a plan view of FIG. 1.

In the arrangement described above, the voltage is applied from the power source to the MR thin films 11 and 12 and the oblique electrodes 17, 17, . . . , and 18, 18, . . . as designated by an arrow with solid line in FIG. 2 to allow a current to flow. A magnetic field is generated by a current $I_1$ flowing through the oblique electrodes 17, 17, . . . , and a bias magnetic field is generated clockwise parallel to the track direction as designated by an arrow $H_1$ with broken line in FIG. 2. A bias magnetic field is generated in a direction opposite to arrow $H_1$ as designated by an arrow $H_2$ with a broken line in FIG. 2 by a current $I_2$ flowing through the oblique electrodes 18, 18, . . . (current $I_2$ flows in a direction opposite to current $I_1$).

Here, the bias magnetic fields perpendicular to the longitudinal direction of both the MR thin films 11 and 12 have opposite direction and the same intensity in the state that the magnetic field from the poles of the magnetizing have pitch longer by several times as the interval d arranged in a gap separated by several times as large as the interval d is not received to the drum of the encoder: Thus, both the MR thin films 11 and 12 have the same resistance value $R_0$ as shown in FIG. 3. When the magnetic field is applied from the pole in the same direction (+) as the track direction, one MR thin film 11 adds the magnetic field by the pole and the bias magnetic field in the same directions to increase the intensity of the magnetic field and to decrease the resistance value to become a saturated state, thereby becoming constant at the resistance value $R_l$. The other MR thin film 12 cancels the magnetic field by the pole and the bias magnetic field in reverse direction to reduce the intensity of the magnetic field and to increase the resistance value $R_h$. When the magnetic field is applied from the pole more than the intensity of the bias magnetic field, the resistance value is decreased. Further, when the magnetic field is applied from the pole in reverse direction (−) to the track direction, the resistance value of the one MR thin film 11 is increased to $R_h$, and the resistance value of the other MR thin film 12 is decreased.

For example, a distribution of the magnetized state is arranged such that a spacing d between the MR thin film 11 and the MR thin film 12 opposing the randomly arranged magnetic scales in a plurality of magnetizing pitches shown in FIG. 4(a) has the shortest distance P between S-pole and N-pole within a plurality of magnetizing pitches. In the case that the plurality of random arranged magnetizing pitches are made as a mode switch or an absolute switch, the magnetizing operation is carried out with a spacing P.n multiplied by a positive multiplier n (n = 1, 2, 3, 4, 5, . . . ; n = 1, 1.1., 1.2, 1.3, 1.4, . . . ; n = 1; 4/3, 5/3, 2, 7/3, 8/3, . . . etc.) in respect to the minimum magnetizing pitch P of S-pole and N-pole. In the case that the plurality of random magnetizing pitches are of an index pulse detecting arrangement, the minimum magnetizing pitches of S-pole and N-pole are in one place and the remaining portions are sufficiently wider than this minimum magnetizing pitch P. The MR thin film 11 and the MR thin film 12 arranged in a spacing d less than the minimum magnetizing pitch P are crossed with the magnetic field from the magnetic poles oppositely arranged to each other even if they are opposed to each other while a central position in the spacing d is coincided with a central position of either S-pole or N-pole having any length. This is similarly applied to the case that all the spacing of the magnetic poles are of the same pitch P.

In the case that the magnetic scale in which the magnetizing pitch in FIG. 4(a) is arranged at random is detected by the MR thin films 11 and 12 shown in FIG. 2, a voltage waveform shown in FIG. 4(b) is obtained from the signal output terminals 19 of the MR thin films 11 and 12. This means that the magnetic fields crossing with the MR thin films 11 and 12 directed from N-pole of each of the magnetic poles to S-pole are the same as a direction of track in FIG. 2, for example, resulting in that the MR thin film 11 shows a low resistance value R1 and the MR thin film 12 shows a high resistance value Rh so as to output a high signal voltage SH. Similarly, the MR thin film 11 shows a high resistance value Rh from the signal output terminal 19 under a condition in which it is applied in an opposite direction of the direction of the magnetic field to both MR thin films 11 and 12, and then the MR thin film 12 shows a low resistance value R1 and a low signal voltage SL is outputted Then, at the position where the densities of magnetic fluxes crossing with the two MR thin films 11 and 12 are substantially the same to each other, the MR thin films 11 and 12 become the same resistance value Ro as that only the self-biasing magnetic fields $H_1$ and $H_2$ are crossed to each other and then an intermediate value between said high signal voltage SH and the low signal voltage SL is outputted from the signal output terminal 19.

Figure 5:
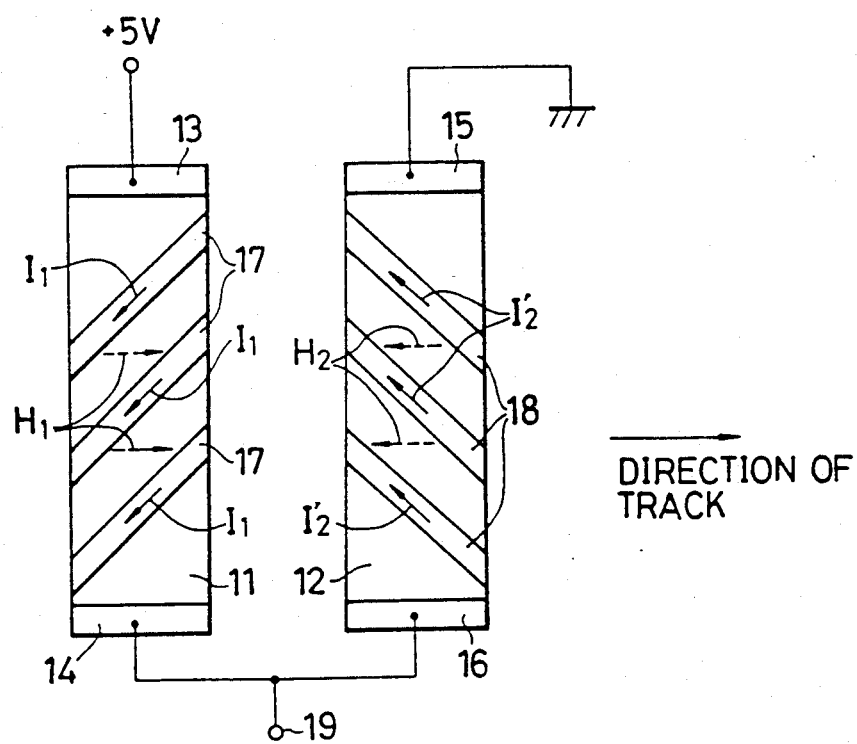
FIG. 5 is a plan view of another embodiment of a magnetic sensor for an encoder of the invention.
Figure 6:
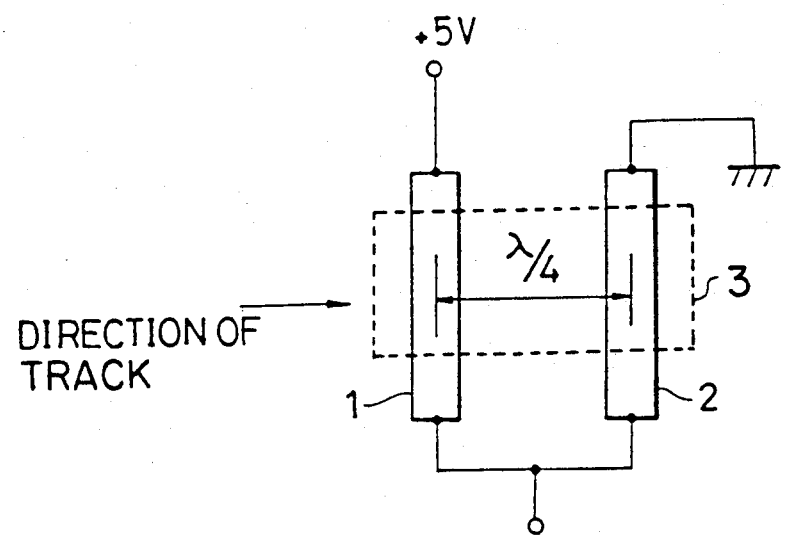
FIG. 6 is a plan view of one example of a conventional magnetic sensor for an encoder.
Figure 7:
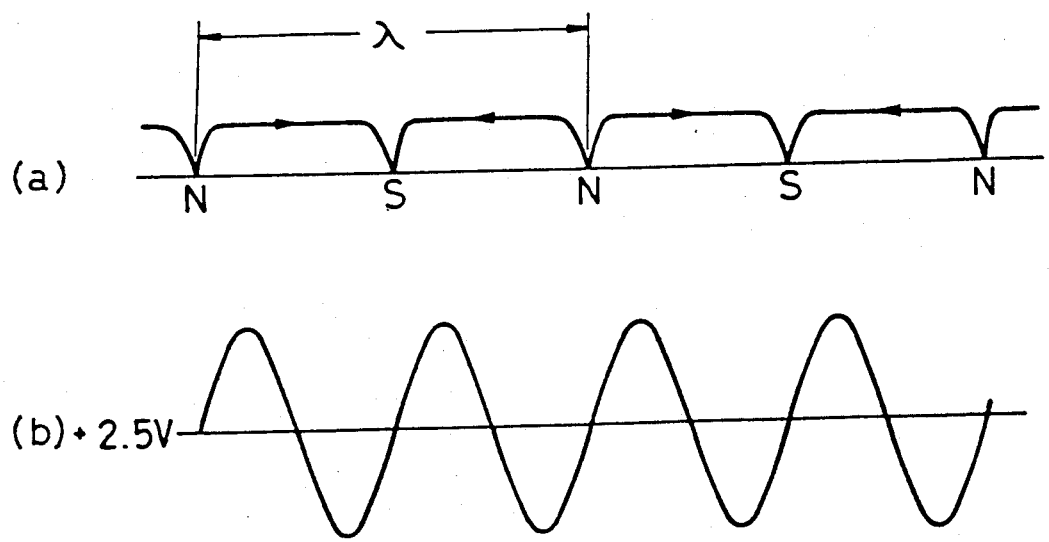
FIG. 7 is a view showing the signal output of the magnetic sensor in FIG. 6.

Referring now to FIG. 5, another preferred embodiment of the present invention is described. This figure is a top plan view showing an arrangement of a magnetic sensor to be used in the device of the present invention. The same component elements as those shown in FIG. 2 are designated with the same reference symbols.

A major difference between the above-mentioned preferred embodiment and another preferred embodiment is that the inclining directions of oblique electrodes 17, 17 . . . arranged in the MR thin films 11 and 12 and the other oblique electrodes 18, 18 . . . are the same in the above-mentioned preferred embodiment and in turn the inclining directions of the oblique electrodes 17, 17 . . . and the other oblique electrodes 18', 18' . . . arranged on the MR thin films 11 and 12 in the other preferred embodiment are symmetrical in linear form and opposite to each other. Even under such an arrangement as above, the directions of the biasing currents in the MR thin film 11 and MR thin film 13 are opposite to each other in their longitudinal direction in a strip-like shape crossing at a right angle a direction of the relative movements of the magnetic scale and the MR thin films 11 and 12. Since the characteristic of shape magnetic anisotropy in the MR thin film 12 has the same condition, even if the current directions to be energized in the oblique electrodes 18, 18 . . . and the oblique electrodes 18', 18' . . . are crossed at a right angle with each other, a direction of the self-biasing magnetic field $H_2$ substantially acting on them is opposite to the direction of track indicated by an arrow in FIG. 2 and this is the same direction as that of the above-mentioned preferred embodiment.

According to the magnetic sensor for the encoder of the invention, the poles arranged at random intervals on the drum of the encoder can be detected. Further, even if the poles arranged at a predetermined interval are detected, it is not necessary to alter the intervals of the two MR thin films at every different interval to be adapted for a mass production.

I claim:

1. A magnetic movement detecting device comprising:
   a magnetic sensor having a first surface and a second surface;
   a magnetic scale having a magnetic medium including a plurality of magnetic poles in which a first interval spacing between at least a first pair of adjoining magnetic poles has a relative different length than a second interval spacing between at least a second pair of adjoining magnetic poles, and wherein said magnetic scale moves in a relative movement direction with respect to said magnetic sensor and in which said plurality of magnetic poles are magnetized in an alternative polarity of N-pole and S-pole;
   a first magnetoresistance effect thin film formed on said first surface of said magnetic sensor and arranged to produce a magnetic anisotropy in which an electrical resistance is varied when a magnetic flux from said plurality of magnetic poles of said magnetic scale is moved in a direction parallel to said relative movement direction of said magnetic scale and in which the electrical resistance is not varied when said magnetic flux is moved in a direction perpendicular to said relative movement direction of said magnetic scale;
   a second magnetoresistance effect thin film formed on said second surface of said magnetic sensor and arranged to produce a magnetic anisotropy in parallel with the magnetic anisotropy of said first magnetoresistance effect thin film in which an electrical resistance is varied, said second magnetoresistance effect thin film being spaced apart from said first magnetoresistance effect thin film with respect to said relative movement direction of said magnetic scale by a distance not greater than a minimum interval spacing of said plurality of magnetic poles;
   a first set and a second set of oblique electrodes of a conductive material having a lower resistivity than a resistivity of said first and second magnetoresistance effect thin films, said first set of oblique electrodes positioned on a surface of said first magnetoresistance effect thin film and said second set of oblique electrodes positioned on a surface of said second magnetoresistance effect thin film, said first and second sets of oblique electrodes arranged such that bias currents energized in each of said first and second magnetoresistance effect thin films generate first and second self-biasing magnetic fields parallel to said relative movement direction of said magnetic scale, said first self-biasing magnetic field having a polarity in a direction opposite to said second self-biasing magnetic field; and
   characterized in that a relative movement of said magnetic scale with respect to said magnetic sensor is detected by a difference of a rate of variation of resistance based on a voltage value between a pair of ends of said first magnetoresistance effect thin film.

2. A magnetic movement detecting device according to claim 1, wherein said first interval spacing is arranged with a distance equal to said minimum interval spacing and wherein said second interval spacing is arranged with a distance equal to a multiple of said minimum interval spacing.

3. A magnetic movement detecting device according to claim 1, wherein a magnetic pole of said magnetic medium is magnetized in either a horizontal or a vertical direction with respect to a direction of thickness of said magnetic medium.

4. A magnetic movement detecting device according to claim 1, wherein said first magnetoresistance effect thin film and said second magnetoresistance effect thin film are each formed in an elongated strip having a longitudinal direction crossing perpendicular to said relative movement direction, and wherein said bias currents are energized in parallel with said longitudinal direction of said first and second magnetoresistance effect thin films and cause a magnetic anisotropy having an axis in parallel with said longitudinal direction.

5. A magnetic movement detecting device according to claim 1, wherein said bias currents energized in each of said first and second magnetoresistance effect thin films are energized in an opposite direction to each other, and wherein said first and second magnetoresistance effect thin films are arranged so that a current derived from said bias currents flows through said first set of oblique electrodes in a direction opposite to a current derived from a said bias currents flowing through said second set of oblique electrodes.

6. A magnetic movement detecting device according to claim 1, wherein said first set and said second set of oblique electrodes are each formed with an equal number of equally-spaced discreet electrodes having lengthwise directions positioned at an equal angle with respect to said relative movement direction.

7. A magnetic movement detecting device according to claim 1, wherein said first interval spacing is arranged with a distance equal to said minimum interval spacing and wherein said second interval spacing is arranged with a distance longer than said minimum interval spacing.

8. A magnetic movement sensing device comprising magnetic tracks including magnetization patterns upon a recording medium, wherein said patterns have a nonuniform pitch spaced along a first direction of relative medium travel to thereby generate magnetic flux, and magnetic field sensing means mounted so that said magnetic tracks and said magnetic field sensing means move relative to one another along said first direction, said magnetic field sensing means comprising:

a first magnetoresistance thin film having a length arranged along a second direction substantially perpendicular to said first direction;

a second magnetoresistance thin film having a length arranged in parallel and adjacent along its entire length to the length of said first magnetoresistance thin film and spaced apart from said first magnetoresistance thin film; and slant electrically conducting electrodes formed on the first and second magnetoresistance thin films extending in a third direction that is diagonal with respect to said first and second directions for conducting a current which generates biased magnetic fields of opposite directions in said second and first magnetoresistance thin films.

9. A magnetic movement sensing device according to claim 8, wherein said electrodes are at an angle of about 45 degrees with respect to said second direction.

* * * * *